(12) United States Patent
Eisner et al.

(10) Patent No.: US 8,086,972 B2
(45) Date of Patent: Dec. 27, 2011

(54) FUNCTIONAL VERIFICATION OF POWER GATED DESIGNS BY COMPOSITIONAL REASONING

(75) Inventors: Cynthia Rae Eisner, Zichron Yaacov (IL); Karen Frida Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 715 days.

(21) Appl. No.: 12/174,650

(22) Filed: Jul. 17, 2008

(65) Prior Publication Data

US 2010/0017764 A1    Jan. 21, 2010

(51) Int. Cl.
*G06F 17/50* (2006.01)
(52) U.S. Cl. .......................... 716/7; 716/5; 716/6; 716/9
(58) Field of Classification Search ........... 716/105–111
See application file for complete search history.

(56) References Cited

U.S. PATENT DOCUMENTS

2008/0127015 A1 *   5/2008   Chandramouli et al. ......... 716/5
* cited by examiner

*Primary Examiner* — Paul Dinh (57) ABSTRACT

A novel and useful method of functional verification of power gated designs by compositional reasoning. The method of the present invention performs a sequential equivalence check between the power gated design and a version of itself in which power gating is disabled. A compositional approach is first used to look for conditional equivalence of each functional block of the circuit (and its corresponding functional block with power gating disabled) under a suitable set of assumptions, guaranteed by the neighboring functional blocks. Circular reasoning rules are then employed to compose the conditional equivalences proved on the individual functional blocks back into total equivalence on the whole circuit.

16 Claims, 5 Drawing Sheets

FUNCTIONAL VERIFICATION OF POWER GATED DESIGNS BY COMPOSITIONAL REASONING

FIELD OF THE INVENTION

The present invention relates to the field of integrated circuit design tools and more particularly relates to a method of verifying power gated circuit designs via sequential and compositional conditional equivalency.

SUMMARY OF THE INVENTION

There is thus provided in accordance with the invention, a method of verifying a circuit comprising a power gated design, the method comprising the steps of creating a version of said circuit, wherein power gating is disabled, defining one or more valid inputs for said circuit comprising a power gated design, performing a sequential equivalence check between said circuit comprising a power gated design and said version comprising a non power gated design utilizing said one or more valid inputs and comparing the outputs of said circuit comprising a power gated design and said circuit wherein power gating is disabled.

There is also provided in accordance of the invention, a method of verifying a circuit comprising a power gated design, the method comprising the steps of partitioning said circuit into a plurality of original functional blocks, wherein power gating is enabled in each said original functional block, creating a corresponding functional block for each original functional block, wherein said corresponding functional block comprises said original functional block in which power gating is disabled, defining one or more valid inputs for each said original functional block, defining one or more valid conditions for each original functional block and its associated corresponding functional block, performing a conditional equivalence check between each said original functional block and each said corresponding functional block utilizing said one or more valid inputs and said one or more valid conditions, thereby determining conditional equivalency and composing said conditional equivalencies to define a compositional conditional equivalency.

There is further provided a computer program product for verifying a circuit comprising a power gated design, the computer program product comprising a computer usable medium having computer usable code embodied therewith, the computer program product comprising computer usable code configured for creating a version of said circuit, wherein power gating is disabled, computer usable code configured for defining one or more valid inputs for said circuit comprising a power gated design, computer usable code configured for performing a sequential equivalence check between said circuit comprising a power gated design and said version comprising a non power gated design utilizing said one or more valid inputs and computer usable code configured for comparing the outputs of said circuit comprising a power gated design and said circuit wherein power gating is disabled.

There is also provided a computer program product for verifying a circuit comprising a power gated design, the computer program product comprising a computer usable medium having computer usable code embodied therewith, the computer program product comprising computer usable code configured for partitioning said circuit into a plurality of original functional blocks, wherein power gating is enabled in each said original functional block, computer usable code configured for creating a corresponding functional block for each original functional block, wherein said corresponding functional block comprises said original functional block in which power gating is disabled, computer usable code configured for defining one or more valid inputs for each said original functional block, computer usable code configured for defining one or more valid conditions for each original functional block and its associated corresponding functional block, computer usable code configured for performing a conditional equivalence check between each said original functional block and each said corresponding functional block utilizing said one or more valid inputs and said one or more valid conditions, thereby determining conditional equivalency and computer usable code configured for composing said conditional equivalencies to define a compositional conditional equivalency.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document:

| Term | Definition |
| --- | --- |
| ASIC | Application Specific Integrated Circuit |
| CD-ROM | Compact Disc Read Only Memory |
| CPU | Central Processing Unit |
| DSP | Digital Signal Processor |
| EEROM | Electrically Erasable Read Only Memory |
| EPROM | Erasable Programmable Read-Only Memory |
| FPGA | Field Programmable Gate Array |
| FTP | File Transfer Protocol |
| HTTP | Hyper-Text Transport Protocol |
| I/O | Input/Output |
| LAN | Local Area Network |
| NIC | Network Interface Card |
| PM | Power Manager |
| RAM | Random Access Memory |
| RF | Radio Frequency |
| ROM | Read Only Memory |
| WAN | Wide Area Network |

Detailed Description of the Invention

The present invention is a method of performing a sequential equivalence check between the power gated design and a version of itself in which power gating is disabled. A compositional approach is first used to look for conditional equivalence of each functional block of the circuit (and its corresponding functional block with power gating disabled) under a suitable set of assumptions, guaranteed by neighboring functional blocks. Circular reasoning rules are then employed to compose the conditional equivalences proved on the individual functional blocks back into total equivalence on the whole circuit.

The method of present invention employs a methodology that addresses functional verification of a circuit design implementing power gating, where the verification task is segmented into two steps. First, correct functionality of the design is checked when power gating is disabled, using the usual techniques (formal and/or dynamic). Second, a sequential equivalence check is performed between a version of the design with power gating enabled and one with it disabled.

Due to the increasing complexity of power gated circuit designs, the circuit is partitioned into functional blocks and a sequential equivalence check is performed on each block. Conditions are identified where the interface between a power gated functional block and its neighbors (i.e. functional blocks) is "active", and therefore preserving power gating unit functionality at that point. The next step is to prove that the neighboring functional blocks are not affected by a difference in behavior when the interface is not active. Finally, after establishing conditional equivalence of each functional block, circular reasoning rules enable composition of the functional blocks and their respective conditional equivalences into a total equivalence for the entire circuit.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
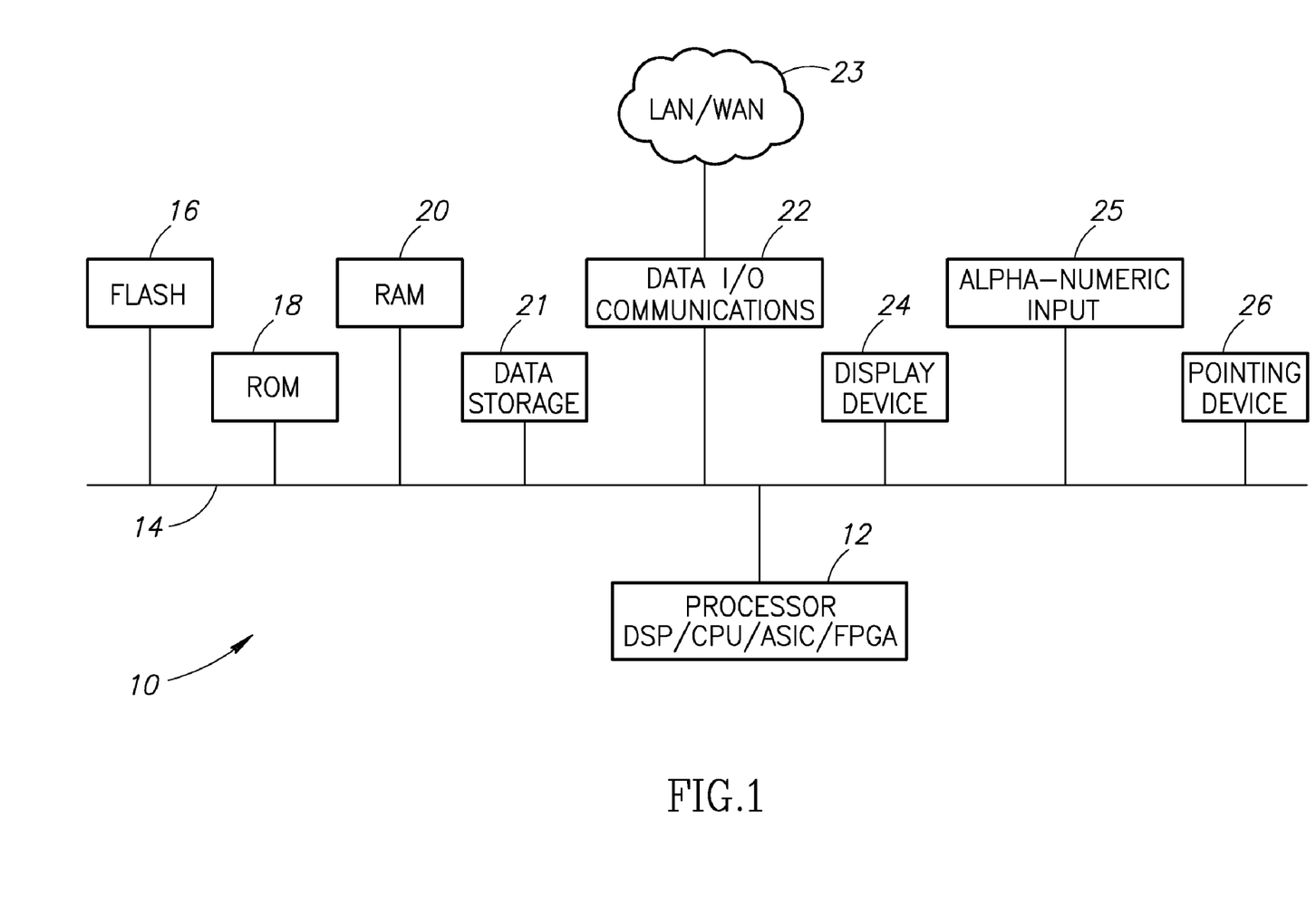
FIG. 1 is a block diagram illustrating an example computer processing system adapted to implement the functional verification of power gated design method of the present invention.

A block diagram illustrating an example computer processing system adapted to implement the functional verification of power gated design method of the present invention is shown in FIG. 1. The computer system, generally referenced 10, comprises a processor 12 which may comprise a digital signal processor (DSP), central processing unit (CPU), microcontroller, microprocessor, microcomputer, ASIC or FPGA core. The system also comprises static read only memory 18 and dynamic main memory 20 all in communication with the processor. The processor is also in communication, via bus 14, with a number of peripheral devices that are also included in the computer system. Peripheral devices coupled to the bus include a display device 24 (e.g., monitor), alpha-numeric input device 25 (e.g., keyboard) and pointing device 26 (e.g., mouse, tablet, etc.)

The computer system is connected to one or more external networks such as a LAN or WAN 23 via communication lines connected to the system via data I/O communications interface 22 (e.g., network interface card or NIC). The network adapters 22 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 52 for storing application programs and data. The system comprises computer readable storage medium that may include any suitable memory means, including but not limited to, magnetic storage, optical storage, semiconductor volatile or non-volatile memory, biological memory devices, or any other memory storage device.

Software adapted to implement the functional verification of power gated design method of the present invention is adapted to reside on a computer readable medium, such as a magnetic disk within a disk drive unit. Alternatively, the computer readable medium may comprise a floppy disk, removable hard disk, Flash memory 16, EEROM based memory, bubble memory storage, ROM storage, distribution media, intermediate storage media, execution memory of a computer, and any other medium or device capable of storing for later reading by a computer a computer program implementing the method of this invention. The software adapted to implement the functional verification of power gated design method of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the complex event processing system rule generation mechanism of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk or CD-ROM or may be downloaded over a network such as the Internet using FTP, HTTP, or other suitable protocols. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Functional Verification of Power Gated Designs

In a first embodiment of the present invention, a corresponding version of the power gated circuit is created with power gating disabled. A sequential equivalence check is performed for the power gated circuit and its corresponding version with power gating disabled using known valid inputs.

In a second embodiment of the present invention, the power gated circuit is partitioned into functional blocks $B_1 \ldots B_n$ (i.e. power gating enabled in each $B_i$). Corresponding functional blocks $B'_1 \ldots B'_n$ are then defined where power gating functionality is disabled in each $B'_i$. A sequential equivalence check is then performed for each $B_i$ and its corresponding $B'_i$. A compositional approach is first used to look for conditional equivalence of each functional block of the circuit under a suitable set of assumptions, guaranteed by the neighboring functional blocks. Circular reasoning rules are then employed to compose the conditional equivalences proved on the individual functional blocks back into total equivalence on the whole circuit.

Note that there are instances where the power gated circuit to be verified comprises both functional blocks that are power gated and functional blocks that are not power gated. In this instance, the effects of power gating may be evident even in the non-power gated blocks by virtue of the inputs passed to them by the power gated blocks. For reasons of explication only, B (comprising the blocks $B_1 \ldots B_n$) is divided into two groups, G and U. Group G consists of the power management unit, all power gated units and all non-power gated units in which the effects of power gating are evident and group U consists of all other blocks.

Figure 2:
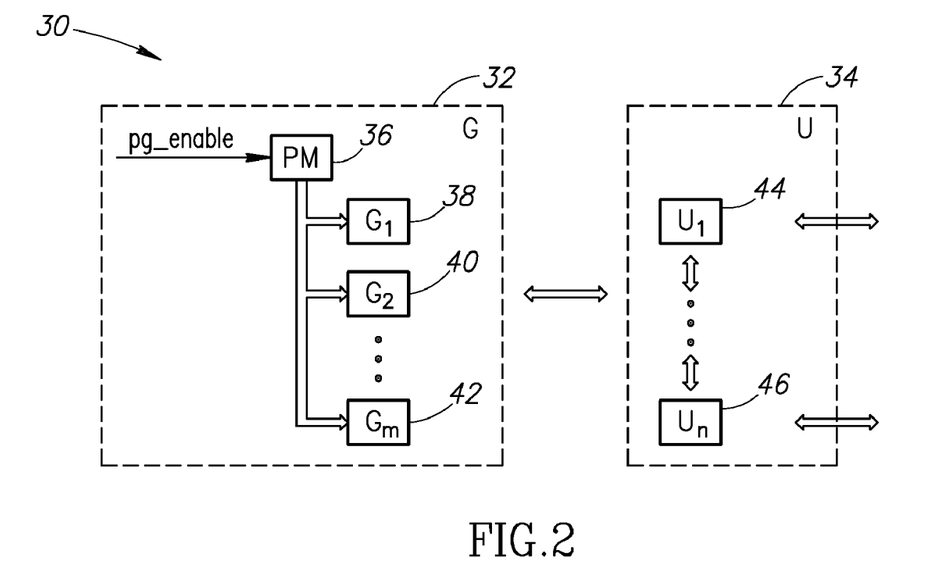
FIG. 2 is a block diagram illustrating the design partitioning step of the present invention.

An example partitioning step of the present invention for this type of circuit is shown in FIG. 2. The block diagram, generally referenced 30, comprises section G 32, consisting of functional blocks which are all power gated and section U 34, consisting of functional blocks in the circuit not implementing power gating logic. Section G is further comprised of power manager (PM) 36 and functional blocks $G_1$ 38, $G_2$ 40 through $G_m$ 42. Section U is further comprised of functional blocks $U_1$ 44 through $U_n$ 46.

Note that G has no interface other than with U. That is, if G receives inputs directly from the chip interface or drives outputs directly to it, we assume for simplicity that they are buffered (with possibly zero delay) through U.

The method of the present invention is to show that the design G||U is equivalent to the design G'||U', where the only difference between the primed and unprimed versions is that pg_enable=1 in G||U whereas pg_enable=0 in G'||U'. This shows that power gating does not affect the functionality of the design as a whole.

The goal of the method of the present invention is to show that G∥U is equivalent to G'∥U'. Due to size problems (i.e. of the circuit) this is performed compositionally, by comparing each Gi with G'i and each Ui with U'i. For simplicity of the explication, the problem is first broken down to comparing G with G' and U with U', and only afterwards how to break the problem down further.

When G is powered off, its outputs are not necessarily equivalent to those of G', therefore precluding full equivalence. Although U and U' will surely behave the same if they receive the same inputs (because there is no difference between them), in the method of the present invention, U will get its inputs from G and U' from G', thus showing equivalence between them is not trivial. Furthermore, care must be taken when comparing G with G'. If the inputs of the power management unit power manager "misbehave", it might shut off some Gi at an inappropriate time, for example, when it is in the middle of processing a transaction. Therefore some minimal guaranteed assumptions are needed for the inputs that influence the power manager.

In order to ensure guaranteed assumptions, a simple observer (i.e. a piece of code) is supplied that monitors the interface between G and U and outputs flags that indicate properties of the interface. Each flag is used as an assumption by one of G∥G' or U∥U' and is guaranteed by the other, and the apparent circularity is broken by induction over time.

Figure 3:
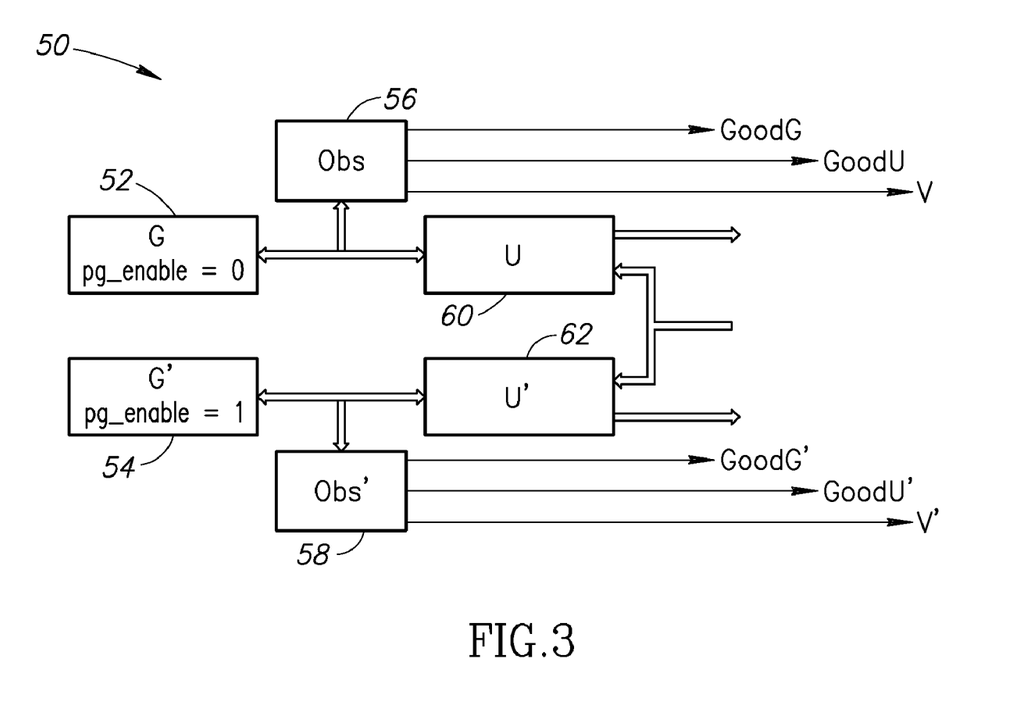
FIG. 3 is a block diagram illustrating the use of an observer with functional blocks to implement the method of the present invention.

An example of using an observer with functional blocks to implement the method of the present invention is shown in FIG. 3. The block diagram, generally referenced 50, comprises observers 56, 58 and functional blocks 52, 54 60 and 62. Observer Obs 56 is associated with functional blocks G 52 and U 60. Observer Obs' 58 is associated with functional blocks G' 54 and 62 U'.

The setup of the methodology of the present invention is as shown in block diagram 50 (where the flags are signals partitioned into sets GoodU, GoodG and V) is as follows:

GoodU: Each flag in this set has the value "1" as long as some assumption about the behavior of U is preserved. These assumptions do not specify the exact correct behavior of U on this interface, only the minimal needed restrictions. As soon as a violation of these assumptions is detected the flag goes to "0" and stays so forever.

GoodG: This set is similar to GoodU, but over G.

V: Conceptually, this set contains a single flag v, which is a "valid" signal that indicates whether the interface between G and U is active. When v=1 the outputs of G and G' are expected to be equivalent, and when v=0 that are not expected to be equivalent. For example, v could be ready ∧transmitting, where ready is an output of U signifying that U is ready to receive data and transmitting is an output of G signifying that G has data ready on the bus. In fact, V is not a single flag but a set of flags, because each Ui may have its own interface with each Gj, and even across a single interface not all signals necessarily follow the same protocol.

The sets GoodU and GoodG are typically initialized as empty sets, with constraints gradually added to refine them as needed. In the general case of assume-guarantee reasoning for functional correctness, this refinement process is complex since it requires a semantic understanding of how the design is intended to work. In the simplified setting described supra, these conditions will typically be simple translations from the English specification of the interface (e.g., "there are no requests during reset"). Moreover, assumptions weaker than those necessary to check functional correctness are used, since it is acceptable for the designs misbehave as long as the two copies (mis)behave in exactly the same way.

Note that it is possible to code a correct design in which the interface between G and U is always active (despite the fact that G can be powered down), and that this does not break the methodology. In such a case the fences and the state retention logic of G will be such that the valid signal has the constant value "1", and the equivalence between U and U' is trivial.

Figure 4:
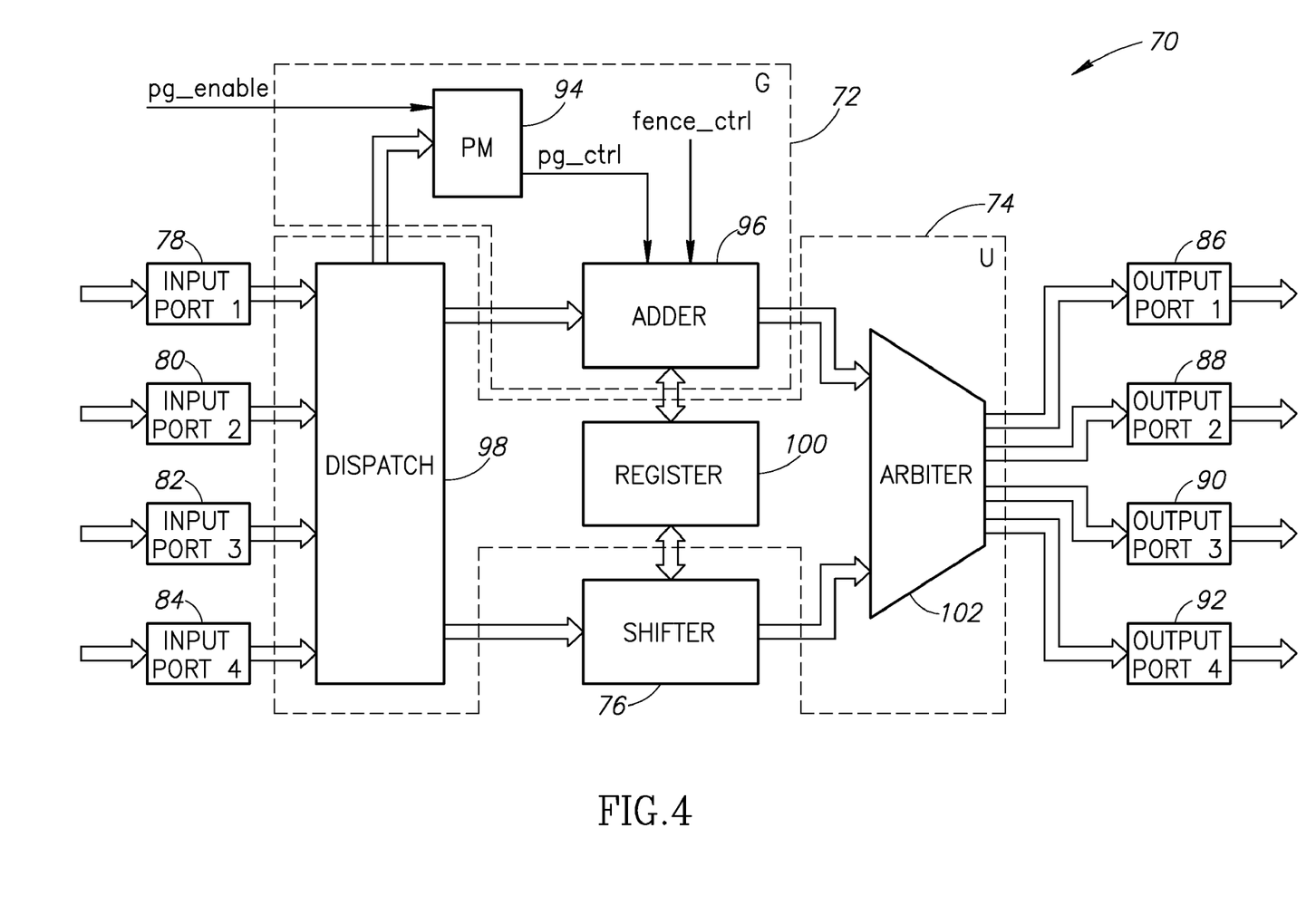
FIG. 4 is a block diagram illustrating a circuit partitioned into functional blocks per the method of the present invention.

An example of a power gated circuit partitioned into functional blocks is shown in FIG. 4. The block diagram, generally referenced 70 comprises power gated functional block G 72, non power gated functional block U 74, shifter 76, input ports 78, 80, 82, 84 and output ports 86, 88, 90, 92. Functional; block G is further comprised of power manager 94 and adder 96. Functional block U is further comprised of dispatch unit 98, registers 100 and arbiter 102.

In the circuit, commands are injected into the unit through the four input ports, and are held in the dispatch queue until they are sent by the dispatch unit to either the adder or the shifter, depending on their type. The results pass to an arbiter, which distributes them to the four output ports. The adder is responsible for all add/subtract and branch commands, while the shifter executes shift and load/store commands. In this implementation the functional block comprising the adder is power gated. The power manager receives commands from the dispatch unit to either turn the adder on or off (via power gating), depending on the instruction type being processed by the dispatch unit.

Figure 5:
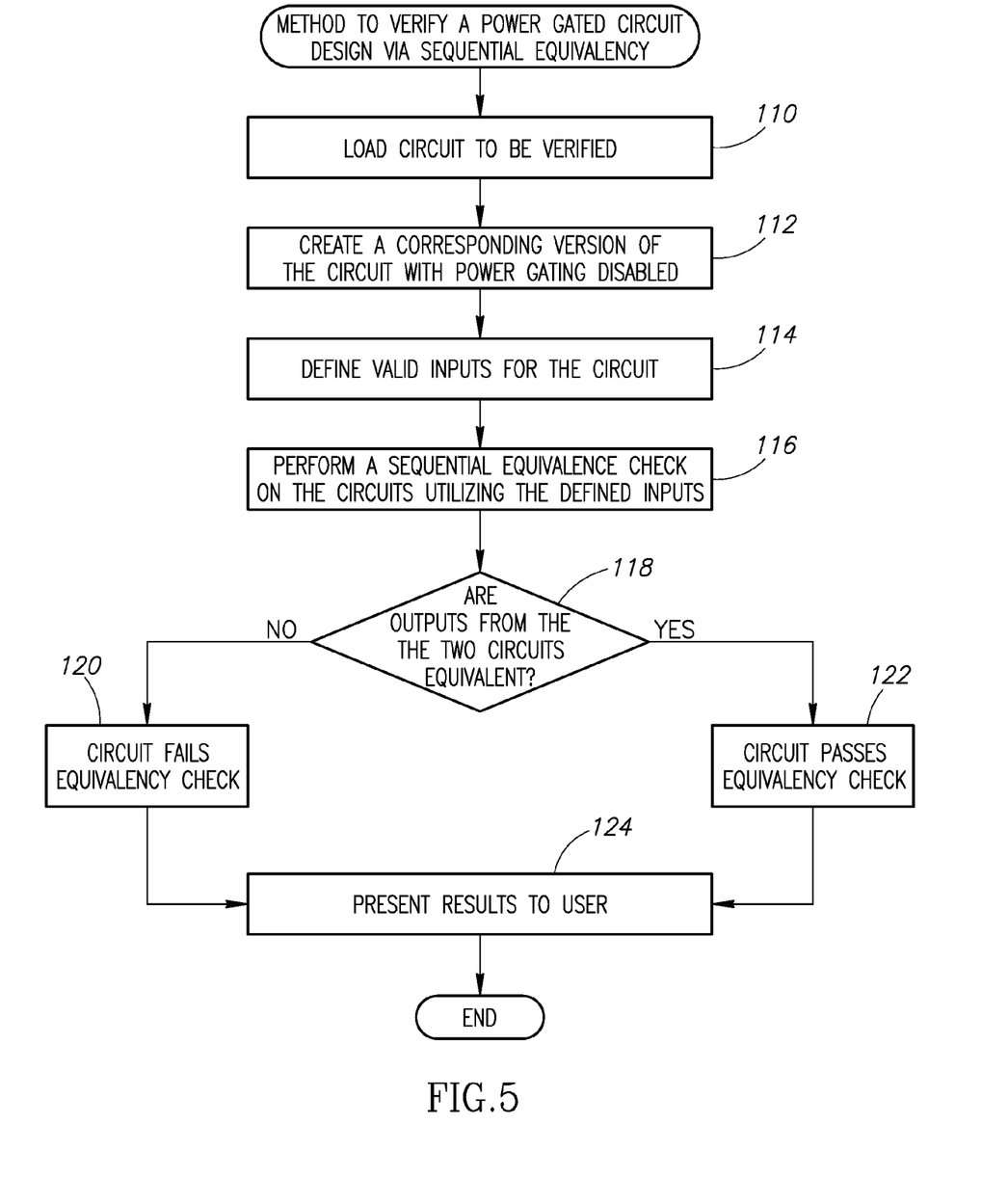
FIG. 5 is a flow diagram illustrating the sequential equivalency verification of power gated design method of the present invention.

A flow diagram illustrating the power gated circuit verification via sequential equivalency method of the present invention is shown in FIG. 5. First, the power gated circuit to be verified is loaded (step 110). A corresponding version of the circuit is created with power gating (step 112). Reasonable valid inputs are then defined for the circuit (step 114). A sequential check is then performed on the original and corresponding circuits using the defined inputs (step 116). If the outputs from the two circuits are equivalent (step 118) then the circuit passes verification (step 122). Otherwise the circuit fails verification (step 120). Finally the results are presented to the user (step 124)

Figure 6:
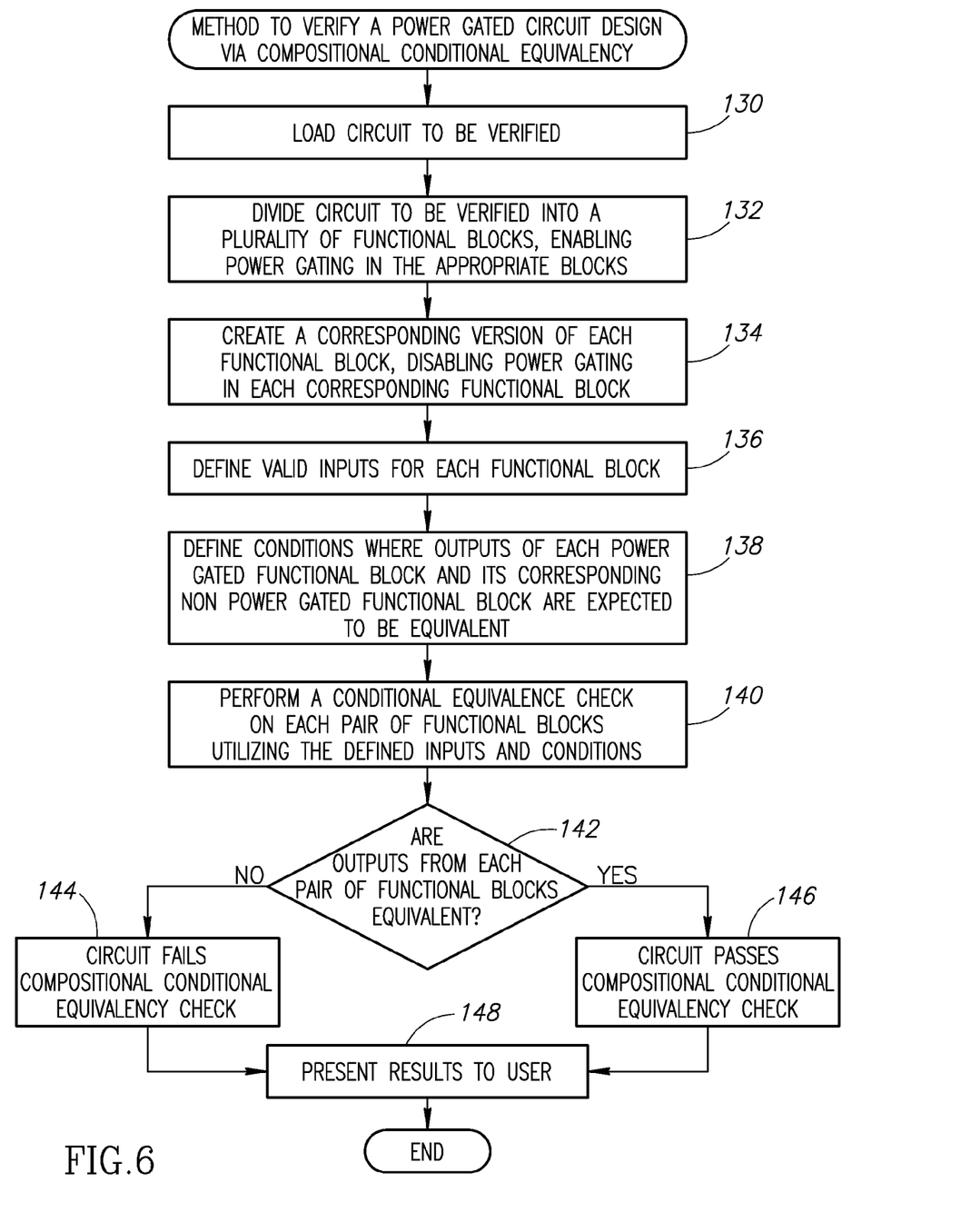
FIG. 6 is a flow diagram illustrating the compositional conditional equivalency verification of power gated design method of the present invention.

A flow diagram illustrating the power gated circuit verification via compositional conditional equivalency method of the present invention is shown in FIG. 6. First, the circuit to be verified is loaded (step 130). The circuit is then partitioned into functional blocks, with power gating enabled in each functional block (step 132). A corresponding version of each functional block is then created, with power gating disabled in each corresponding functional block (step 134). Valid inputs are defined for each functional block (step 136), where the inputs comprise either inputs to the loaded circuit or outputs from other functional blocks. For each functional block conditions (i.e. signals) are defined where the outputs from each pair of functional blocks (i.e. one with power gating enabled and one with power gating disabled) are expected to be equivalent (step 138). Using the defined inputs and conditions, a conditional equivalence check is performed on each pair of functional blocks (step 140). If the outputs from each pair of functional blocks (i.e. each conditional equivalence check) are equivalent (step 142) then the loaded power gated circuit passes verification via compositional conditional equivalency (step 146). Otherwise the loaded power gated circuit fails verification (step 144). Finally, the results are presented to the user (step 148).

Proving Sequential Equivalence

The approach described supra is based on the compositional reasoning rule presented by McMillan in K. L. McMillan, "Verification of an implementation of Tomasulo's algorithm by compositional model checking", CAV '98, pp. 110-121, 1998, and borrows notation therefrom. Following McMillan, the notation is modified by using Q to denote the conjunction of all predicates in the set Q.

Let P be a set of predicates describing the design and let S be a set of predicates defining the specification. For each predicate $s \in S$, let $\epsilon_s \subset P \cup S$ be the environment of s. Intuitively, this is the set of predicates needed in order to show that s holds. We assume a well-founded order $\prec$ on S that defines for each predicate s which other predicates will be assumed up to time i when proving s at time i (this is $Z_s$), and which will be assumed only up to time i−1 (this is $\bar{Z}_s$, the complement of $Z_s$). Then by McMillan we can use Theorem 1 below:

Theorem 1: Let P and S be sets of predicates, for each $s \in S$, let $\epsilon_s \subset P \cup S$ and let $\prec$ be a well-founded order on S. Let $Z_s = P \cup \{s^1 \in S : s^1 \prec s\}$, and for a predicate p let $p \uparrow^\tau$ stand for $\wedge t \leq \tau p(t)$. Then, if for all $s \in S$, $$(\epsilon_s \cap Z_s) \uparrow^\tau \wedge (\epsilon_s \cap \bar{Z}_s) \uparrow^{\tau-1} \Rightarrow s(\tau) \quad (1)$$

is valid, then $(\forall t.P(t)) \Rightarrow \forall t.S(t)$ is valid.

The goal is to use Theorem 1 to prove sequential equivalence between G∥U and G'∥U'. Since we have assumed that all outputs of G∥U are outputs of U it is sufficient to show that the predicate $$EqU(t) \stackrel{def}{=} \{o(t) \leftrightarrow o'(t): o \text{ is an output of } U\} \quad (2)$$

holds at all times t. The following auxiliary sets of predicates are needed:

$$P_{GoodU}(t) \stackrel{def}{=} \{s(t) = 1 \mid s \in GoodU\} \quad (3)$$

$$P_{GoodG}(t) \stackrel{def}{=} \{s(t) = 1 \mid s \in GoodG\} \quad (4)$$

$$P_V(t) \stackrel{def}{=} \{v(t) \leftrightarrow v'(t) \mid v \in V\} \quad (5)$$

$$EqG(t) \stackrel{def}{=} \left\{ \begin{array}{l} v_o(t) \rightarrow (o(t) \leftrightarrow o'(t)): o \text{ is an output of} \\ G \text{ and } v_o \in V \text{ is its associated valid bit} \end{array} \right\} \quad (6)$$

Let G, G', U, U', Ob and Ob' be the sets of predicates describing the respective designs of FIG. 3. Let $\hat{G}=G \cup G' \cup Ob \cup Ob'$ and $\hat{U}=U \cup U' \cup Ob \cup OB'$. Let $P = \hat{G} \cup \hat{U}$ $S = P_V \cup P_{GoodU} \cup P_{GoodG} \cup EqU \cup EqG$.

To begin, it is assumed that the relation $\prec$ is empty, thus for every element s of S, we have $Z_s = P$ and $\bar{Z}_s = S$. Therefore proving the following $$\hat{G} \uparrow^\tau \wedge (EqU \cup P_{GoodU}) \uparrow^{\tau-1} \Rightarrow (EqG \cup P_{GoodG} \cup P_V)(\tau) \quad (7)$$

$$\hat{U} \uparrow^\tau \wedge (EqG \cup P_{GoodG} \cup P_V) \uparrow^{\tau-1} \Rightarrow (EqU \cup P_{GoodU})(\tau) \quad (8)$$

enables us to conclude that $(\forall t.P(t)) \Rightarrow \forall t.S(t)$, and in particular that $(\forall t.P(t)) \Rightarrow \forall t.EqU(t)$, which is the goal.

In practice, there will usually be some combinational paths from inputs to outputs in one or more of G, U and Ob, in which case we will need stronger assumptions for some of the proof obligations. That is, we will need $s\uparrow^\tau$ as opposed to $s\uparrow^{\tau-1}$ for some element $s \in S$ used on the left-hand side of Obligation (1) or (2). Thus we will need to set an order, easily determined from the topology of the design, between the elements of S. As noted by McMillan cited supra, such an order is guaranteed to exist when there are no combinatorial loops in the design. Since a combinatorial loop is a basic structural design error, we are guaranteed the existence of a well-founded order. Using the well-founded order, each of the Obligations (1) and (2) will be split into a number of proof obligations, one for each predicate in the conjunction on the right hand side. For example, let one such predicate be $s(t)=(v_o \rightarrow (o(t) \leftrightarrow o'(t))) \in EqG$, and let $A=\{s'(t)|s' \prec s \text{ and } s' \in EqU \cup P_{GoodU}\}$ and $B=(EqU \cup P_{GoodU}) \backslash A$. The corresponding proof obligation for s is then $$(\hat{G} \cup A)\uparrow^\tau \wedge B \uparrow^{\tau-1} \Rightarrow (v_o \rightarrow (o(\tau) \leftrightarrow o'(\tau))) \quad (9)$$

Conceptually, it has been convenient up till now to view G and U as monolithic units. However, in reality each will typically consist of a number of smaller units, as shown in FIG. 2. Thus we would like to decompose the verification problem further by considering each $G_i$ and $U_i$ separately. For an output o of some $U_i$, we would like to use only $U_i$ rather than all of U on the left hand side of its proof obligation. To do so, we must add the following predicates to S:

$$EqIntU(t) \stackrel{def}{=} \left\{ \begin{array}{l} s(t) \leftrightarrow s'(t): s \text{ is an interface signal} \\ \text{between } U_i \text{ and } U_j \text{ for some } i \neq j \end{array} \right\} \quad (10)$$

The situation for a single $G_i$ is slightly more complicated: we must include the power management unit PM together with each $G_i$, and the predicates that we add for the outputs of $G_i$ will be conditional, thus we might need to add some new valid signals. Denote the new valid signals by $V_{new}$. Then we add the following additional predicates to S:

$$P_{Vnew}(t) \stackrel{def}{=} \{v(t) \leftrightarrow v'(t) \mid v \in V_{new}\} \quad (11)$$

$$EqIntG(t) \stackrel{def}{=} \left\{ \begin{array}{l} v_s(t) \rightarrow (s(t) \leftrightarrow s'(t)): s \text{ is an interface} \\ \text{signal between } G_i \text{ and } G_j \text{ for} \\ \text{some } i \neq j \text{ and } v_s \in \{V \cup V_{new}\} \\ \text{is its associated valid bit} \end{array} \right\}$$

The order $\prec$ is easily extended to the new predicates by a topological analysis of the design. For each output o of some $G_i$ or $U_i$, we verify its proof obligation using $\hat{G}_i$ or $\hat{U}_i$ in place of $\hat{G}$ or $\hat{U}$, where $\hat{G}_i = PM \| G_i \| G_i'$ and $\hat{U}_i = U_i \| U_i'$.

Note that the theory supports multiply clocked designs as well as singly clocked ones. In the case of a singly clocked design, each time t is simply a tick of the clock. In the case of a multiply clocked design, each time t is a tick of the smallest granularity of time as seen by the verification tool (this is exactly the same as in model checking or equivalence checking of multiply clocked designs).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable other of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of verifying a circuit comprising a power gated design, said method comprising the steps of:
    partitioning said circuit into a plurality of original functional blocks, wherein power gating is enabled in each said original functional block;
    creating a corresponding functional block for each original functional block, wherein said corresponding functional block comprises said original functional block in which power gating is disabled;
    defining one or more valid inputs for each said original functional block;
    defining one or more valid conditions for each original functional block and its associated corresponding functional block;
    performing, by using a computer, a conditional equivalence check between each said original functional block and each said corresponding functional block, utilizing said one or more valid inputs and said one or more valid conditions, thereby determining conditional equivalency; and
    verifying, based on the conditional equivalence check, that outputs from each of the original functional blocks and the associated corresponding functional blocks are equivalent.

2. The method according to claim 1, wherein one or more of said plurality of original functional blocks comprises a power gated design.

3. The method according to claim 1, wherein zero or more of said plurality of original functional blocks comprises a non power gated design.

4. The method of claim 3, wherein said functional block comprising a non power gated design directly interacts with a functional block comprising a power gated design.

5. The method according to claim 1, wherein one or more of said valid inputs comprise an output from a separate functional block.

6. The method according to claim 1, wherein each of said one or more conditions comprise a signal indicating whether the interface between an original functional block and its corresponding function block is active.

7. The method according to claim 1, wherein said conditional equivalency comprises equivalent outputs of said original functional block and its corresponding functional block.

8. The method according to claim 1, wherein said compositional conditional equivalency comprises all said original functional blocks and their corresponding functional blocks having conditional equivalency.

9. A computer program product for verifying a circuit comprising a power gated design, the computer program product comprising a non-transitory computer usable medium storing computer usable codes, wherein the computer usable codes when executed by a computer perform operations comprising:
    partitioning said circuit into a plurality of original functional blocks, wherein power gating is enabled in each said original functional block;
    creating a corresponding functional block for each original functional block, wherein said corresponding functional block comprises said original functional block in which power gating is disabled;
    defining one or more valid inputs for each said original functional block;
    computer usable code configured for defining one or more valid conditions for each original functional block and its associated corresponding functional block;
    performing a conditional equivalence check between each said original functional block and each said corresponding functional block, utilizing said one or more valid inputs and said one or more valid conditions, thereby determining conditional equivalency; and
    verifying, based on the conditional equivalence checks, that outputs from each of the original function blocks and the associated corresponding functional blocks are equivalent.

10. The computer program product of claim 9, wherein one or more of said plurality of original functional blocks comprises a power gated design.

11. The computer program product of claim 9, wherein zero or more of said plurality of original functional blocks comprises a non power gated design.

12. The computer program product of claim 11, wherein said functional block comprising a non power gated design directly interacts with a functional block comprising a power gated design.

13. The computer program product of claim 9, wherein one or more of said valid inputs comprise an output from a separate functional block.

14. The computer program product of claim 9, wherein each of said one or more conditions comprise a signal indicating whether the interface between an original functional block and its corresponding function block is active.

15. The computer program product of claim 9, wherein said conditional equivalency comprises equivalent outputs of said original functional block and its corresponding functional block.

16. The computer program product of claim 9, wherein said compositional conditional equivalency comprises all said original functional blocks and their corresponding functional blocks having conditional equivalency.

* * * * *